US009092043B2

(12) United States Patent
Nascimento

(10) Patent No.: US 9,092,043 B2
(45) Date of Patent: Jul. 28, 2015

(54) POWER SWITCH WITH CURRENT LIMITATION AND ZERO DIRECT CURRENT (DC) POWER CONSUMPTION

(71) Applicant: Freescale Semiconductor, Inc., Austin, TX (US)

(72) Inventor: Ivan Carlos Ribeiro Nascimento, Campinas (BR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 53 days.

(21) Appl. No.: 13/973,697

(22) Filed: Aug. 22, 2013

(65) Prior Publication Data

US 2015/0054477 A1 Feb. 26, 2015

(51) Int. Cl.
*G05F 1/46* (2006.01)
*G05F 3/26* (2006.01)
*H03K 17/06* (2006.01)
*H03K 17/16* (2006.01)

(52) U.S. Cl.
CPC .............. *G05F 3/262* (2013.01); *H03K 17/063* (2013.01); *H03K 17/162* (2013.01); *G05F 1/462* (2013.01); *G05F 1/468* (2013.01)

(58) Field of Classification Search
CPC ........... G05F 3/16; G05F 3/262; G05F 1/462; G05F 1/468; H02M 3/158; H02M 3/36
USPC .......................... 323/315, 317, 901
See application file for complete search history.

(56) References Cited

U.S. PATENT DOCUMENTS

| 5,422,593 | A | 6/1995 | Fujihira |
| 5,473,276 | A | 12/1995 | Throngnumchai |
| 5,801,523 | A | 9/1998 | Bynum |
| 6,052,006 | A | 4/2000 | Talaga, Jr. et al. |
| 7,463,013 | B2 * | 12/2008 | Plojhar .......................... 323/315 |
| 8,063,624 | B2 * | 11/2011 | Ribeiro do Nascimento et al. ............................. 323/315 |

FOREIGN PATENT DOCUMENTS

WO 2008005023 A1 1/2008

OTHER PUBLICATIONS

European Patent Office, "Extended European Search Report" in EPO Application No. 14 179 999.9, mailed on May 2, 2015.

* cited by examiner

*Primary Examiner* — Fred E Finch, III
*Assistant Examiner* — Rafael O De Leon Domenech
(74) *Attorney, Agent, or Firm* — Luiz von Paumgartten; Fogarty, L.L.C.

(57) ABSTRACT

Power switches with current limitation and zero Direct Current (DC) power consumption. In an embodiment, an integrated circuit includes switching circuitry coupled between a voltage supply node and a given one of a plurality of power domains, the switching circuitry configured to limit an amount of current drawn by the given power domain from the voltage supply node during a transition period, the switching circuitry further configured to consume zero DC power outside of the transition period. In another embodiment, a method includes controlling, via a switching circuit coupled between a voltage supply and an integrated circuit, an amount of current drawn by the integrated circuit from the voltage supply during a transition period; and causing the switching circuit to consume no static power during periods of time other than the transition period.

18 Claims, 5 Drawing Sheets

POWER SWITCH WITH CURRENT LIMITATION AND ZERO DIRECT CURRENT (DC) POWER CONSUMPTION

FIELD

This disclosure relates generally to electronic circuits and devices, and more specifically, to power switches with current limitation and zero Direct Current (DC) power consumption.

BACKGROUND

A technique for managing the power consumption of electronic devices involves the use of Integrated Circuits (ICs) that have multiple power domains. Generally speaking, each power domain allows a circuit block within the IC to use a different amount of power than other circuit blocks. For example, the use of power domains may enable one or more circuit blocks to receive different amounts of power depending upon the device's mode of operation, which can change over time.

In some cases, different power domains may be separated by one or more power switches or the like. For example, when a circuit block within a given power domain is turned on, a corresponding switch may allow that circuit to draw electrical current from a power source.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Figure 1:
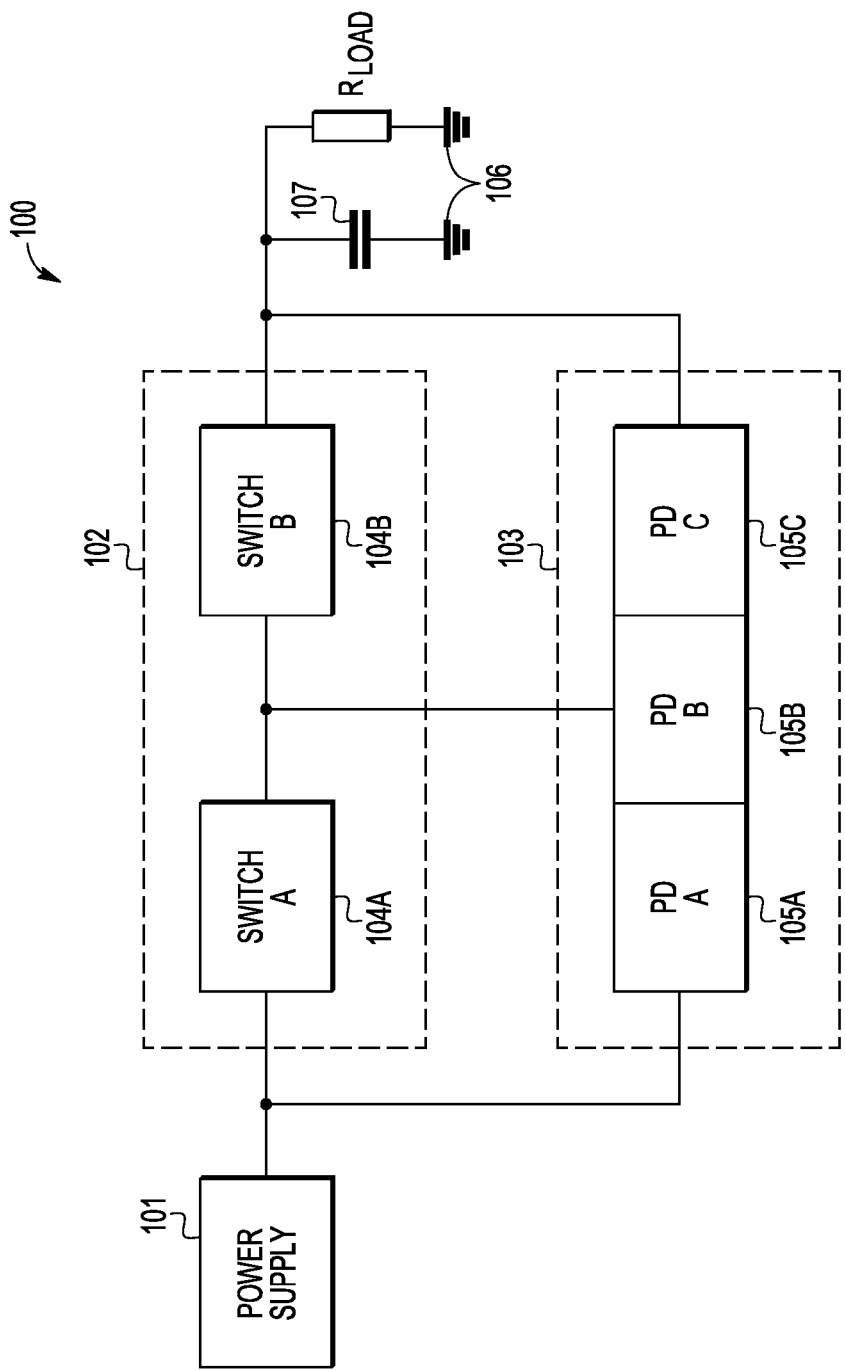
FIG. 1 is a block diagram of an example of an Integrated Circuit (IC) according to some embodiments.

Turning to FIG. 1, a block diagram of an example of an Integrated Circuit (IC) 100 is depicted according to some embodiments. In this example, power supply 101 is coupled to portion 103 of IC 100 having three power domains (PDs) 105A-105C. Power supply 101 is also coupled to power switch bank 102 including switch 104A, which is coupled to switch 104B. Switch bank 102 is in turn is coupled to load $R_{LOAD}$ and in parallel with capacitor 107. Ground or some other reference node or bus 106 is also shown. In this example, the node between switches 104A and 104B is coupled to power domain 105B.

Generally speaking, power switch bank 102 operates to separate the various power domains 105A-105C. Even when power domains 105A-105C are configured to operate based on the same supply voltage, they may each be configured to draw up to a maximum amount of current from power supply 101. For example, power domain 105A may be configured to use up to 500 mA, power domain 105B may be configured to use up to 80 mA, and power domain 105C may be configured to use up to 8 mA.

In some embodiments, one or more of power switches 104A and/or 104B may be configured to limit an amount of current drawn by a given one of power domains 105A-C from power supply 101 during a transition period—e.g., during the powering up of the given power domain. Additionally or alternatively, one or more of power switches 104A and/or 104B may be configured to consume zero Direct Current (DC) power, also known as static power, outside of the transition period and when in steady state, be it closed or open (excluding consumption due to leakage effects or the like).

In some embodiments, power supply 101 may include a power source, voltage regulator, etc. Power domains 105A-C may represent different areas of IC 100 responsible for performing different operations. For example, each of power domains 105A-C may include analog circuits, digital memories, processors, etc. Moreover, it should be noted that IC 100 is shown for sake of illustration only. In various embodiments, any number of power supplies, switches, and/or power domains may be used, and these elements may be coupled to one another in any suitable manner.

Figure 2:
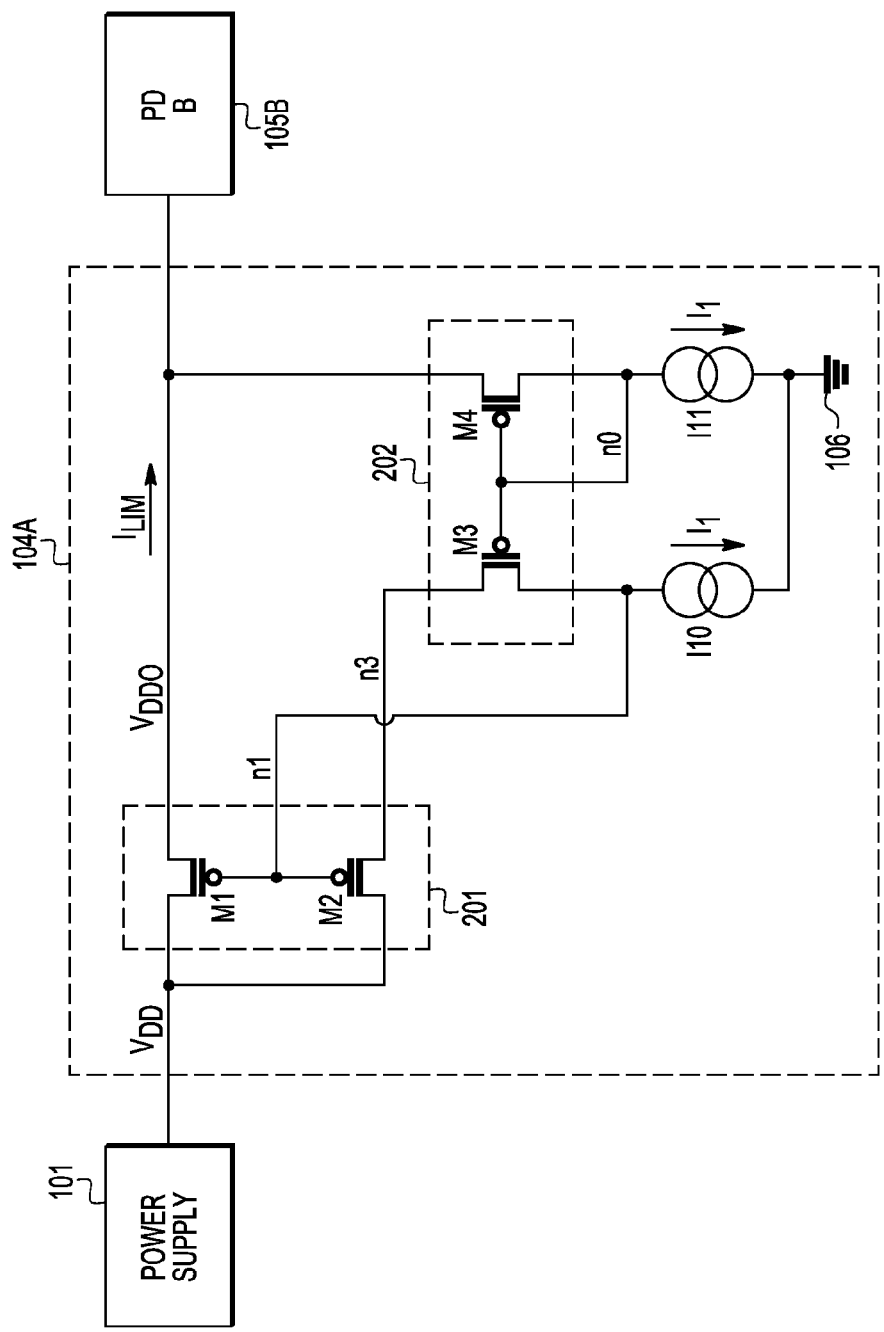
FIG. 2 is a circuit diagram of an example of a power switch with current limitation according to some embodiments.

FIG. 2 is a circuit diagram of an example of power switch 104A with current limitation according to some embodiments. For sake of context, power switch 104A is shown coupled between power supply 101 and power domain 105B, as originally discussed in FIG. 1. It will be understood, however, that switch 104A may be used in other contexts as well.

As illustrated, switch 104A includes first P-type Metal-Oxide-Semiconductor (PMOS) transistor M1 having its source terminal (more generally referred to as a first current terminal or electrode) coupled to power supply 101, thus receiving supply voltage $V_{DD}$, and its drain terminal (more generally referred to as a second current terminal or electrode) coupled to power domain 105B, thus providing $V_{DDO}$ (where $V_{DDO}$ is equal to $V_{DD}$ minus the voltage drop across M1) to power domain 105B. Second PMOS transistor M2 has its source terminal coupled to power supply 101, thus also receiving supply voltage $V_{DD}$, and its gate (more generally referred to as a control terminal or electrode) coupled to the gate of first PMOS transistor M1. In combination, transistors M1 and M2 form first current mirror 201. As shown in more detail below, M1 operates as a current limitation transistor, whereas M2 operates as a main switching transistor.

Switch 104A also includes third PMOS transistor M3 having its source terminal coupled to the drain terminal of second PMOS transistor M2, and its drain terminal coupled to node n1 and to the gates of the first and second PMOS transistors M1 and M2, respectively. Fourth PMOS transistor M4 has its source terminal coupled to the drain terminal of first PMOS transistor M1, its drain terminal coupled to node n0, and its gate terminal coupled to the gate terminal of third PMOS transistor M3 and to node n0. As such, transistors M3 and M4 form second current mirror 202. Current source I10 is coupled between node n1 and reference node 106, and current source I11 is coupled between node n0 and reference node 106. Current sources I10 and I11 may be implemented using well-known components.

Nodes n0, n1, and n3 are shown such that node n1 is the node between the gate terminals of transistors M1 and M2, the drain terminal of transistor M3, and current source I10. Node n0 is the node between the gate terminals of transistors M3 and M4, the drain terminal of transistor M4, and current source I11. Node n3 is the node between the drain of transistor M2 and the source of transistor M3.

In operation, switch 104A allows only a limited amount of electrical current $I_{LIM}$ to be provided to power domain 105B. The analysis that follows shows, among other things, that $I_{LIM}$ is a function of the current at the drain terminals of transistors M3 and M4, designated as $I_1$, as well as of the aspect ratios of transistors M1 and M2.

For transistors M3 and M4 transistors let us define:

$$K_{34} = \frac{W_3/L_3}{W_4/L_4}$$

where $W_n$ is the width and $L_n$ is the length of the channel formed in transistor $M_n$ such that $W_3/L_3$ is the aspect ratio of transistor M3 and $W_4/L_4$ is the aspect ratio of transistor M4. For example, in some embodiments, transistors M3 and M4 may be unbalanced such that $W_4/L_4$ is greater than $W_3/L_3$. Also, in some implementations, the gate-to-source voltage of transistor M3 ($V_{GS3}$) is greater than the gate-to-source voltage of transistor M4 ($V_{GS4}$), such that $K_{34}<1$. As such, the current equations for transistors M3 and M4 in saturation are:

$$I_{D3} = \frac{K_P}{2} \cdot \frac{W_3}{L_3} \cdot (V_{GS3} - V_T)^2 = I_1$$

$$I_{D4} = \frac{K_P}{2} \cdot \frac{W_4}{L_4} \cdot (V_{GS4} - V_T)^2 = I_1$$

where $I_{Dn}$ is the drain current of transistor $M_n$. If we use $V_T$ as the threshold voltage and $K_p$ as the transconductance parameter for transistor M3, then:

$$V_{GS4} = V_T + \sqrt{\frac{I_1}{\frac{K_P}{2} \cdot \frac{W_4}{L_4}}}$$

Considering M3 to be in its saturation region, this yields:

$$\frac{W_3}{L_3} \cdot (V_{GS3} - V_T)^2 = \frac{W_4}{L_4} \cdot (V_{GS4} - V_T)^2, \text{ and}$$

$$\sqrt{K_{34}} \cdot (V_{GS3} - V_T) = (V_{GS4} - V_T)$$

The difference of $V_{GS}$ drop voltages, in saturation region, considering the same $I_1$ current pass by M3 and M4 is calculated. The $\Delta V_{GS34}$ is then calculated as:

$$\Delta V_{GS34} = (V_{GS3} - V_{GS4}) = \left(\frac{1}{\sqrt{K_{34}}} - 1\right) \cdot (V_{GS4} - V_T)$$

In conclusion, while ($V_{GS3}$-$V_{GS4}$) is equal or greater than $\Delta V_{GS34}$, transistor $M_3$ will allow $I_1$ current to pass, and, therefore, $V_{DSM3}$ will be low (whether transistor $M_3$ is in saturation, triode or linear regions). Conversely, if $V_{GS3}$ is not higher than $V_{GS4}$ by at least $\Delta V_{GS34}$, then transistor $M_3$ will just allow a current lower than $I_1$ to pass, and $V_{DS3}$ will increase.

The remainder of the analysis depends upon whether transistors M1 and M2 are operating either in saturation mode or in triode/linear modes. Particularly, when $V_{DD} \gg V_{DDO}$, transistors M1 and M2 are in saturation region. The saturation region is defined as the region where the $V_{DS}$ drop voltages of $M_1$ and $M_2$ are above the saturation $V_{DS}$, that is, $V_{DS1} > V_{DS\_SAT\_M1}$ and $V_{DS2} > V_{DS\_SAT\_M2}$, where:

$$V_{DS1} = V_{DD} - V_{DDO} \text{ and } V_{DS2} = V_{DD} - V(n3)$$

According to the MOS model, the minimum VDS for saturation is given by:

$$V_{DS\_SAT\_M2} = V_{GSM2} - V_T = V_{DD} - V(n1) - V_T \text{ and}$$
$$V_{DS\_SAT\_M1} = V_{GSM1} - V_T = V_{DD} - V(n1) - V_T$$

In order to ensure that M1 and M2 are in the saturation region, the equations above can be rewritten as:

$$V_{DD} - V_{DDO} > V_{DD} - V(n1) - V_T \text{ and } V_{DD} - V(n3) > V_{DD} - V(n1) - V_T$$

Writing the saturation region equation for $M_2$ and considering $I_{D2} = I_1$ yields:

$$I_{D2} = I_1 = \frac{K_P}{2} \cdot \frac{W_2}{L_2} \cdot (V_{GS2} - V_T)^2$$

Further, writing the saturation region equation for $M_1$ considering $V_{GS1} = V_{GS2}$ we obtain $I_{D1}$:

$$I_{D1} = I_{LIM} = \frac{K_P}{2} \cdot \frac{W_1}{L_1} \cdot (V_{GS2} - V_T)^2$$

Finally, combining both equations for transistors $M_1$ and $M_2$ provides the following equation for $I_{LIM}$:

$$I_{LIM} = I_1 \frac{W_1/L_1}{W_2/L_2} \qquad \text{Eq. 1}$$

In other words, when transistors $M_1$ and $M_2$ are in saturation, the current provided to power domain 105B is limited to $I_{LIM}$. This current is a function of $I_1$ as well as the sizes of M2 and M1, and can be held constant.

Transistors M1 and M2 are in triode and linear regions when their drain-to source voltages ($V_{DS}$) are equal or below the saturation $V_{DS}$, that is $V_{DSM1} \leq V_{DS\_SAT\_M1}$ and $V_{DSM2} \leq V_{DS\_SAT\_M2}$. These conditions yield:

$$V_{DD} - V_{DDO} \leq V_{DD} - V(n1) - V_T \text{ and } V_{DD} - V(n3) \leq V_{DD} - V(n1) - V_T$$

From the equations above we deduct that $V_{DSM3} \geq V_T$. Hence, writing the $I_{D2}$ equation in triode region results in:

$$I_{D2} = I_1 = K_P \cdot \frac{W_2}{L_2} \cdot \left\{(V_{GS2} - V_T) \cdot V_{DS2} - \frac{V_{DS2}^2}{2}\right\}$$

By circuit inspection is possible to see that:

$$V_{DS2} + V_{GS3} = V_{DS1} + V_{GS4}$$

Because:

$$V_{DS1} = V_{DD} - V_{DDO} \text{ and } V_{GS3} - V_{GS4} = \Delta V_{GS34}$$

it results that:

$$V_{DS2} = V_{DS1} - \Delta V_{GS34} = V_{DD} - V_{DDO} - \Delta V_{GS34}$$

Accordingly, $$(V_{GS2} - V_T) = \frac{1}{V_{DS2}} \cdot \left\{ \frac{I_1}{K_P \cdot W_2/L_2} + \frac{V_{DS2}^2}{2} \right\}, \text{ and}$$

$$I_{D1} = I_{LIM} = K_P \cdot \frac{W_2}{L_2} \cdot \left\{ (V_{GS2} - V_T) \cdot V_{DS1} - \frac{V_{DS1}^2}{2} \right\}$$

As such, current $I_{LIM}$, when M1 and M2 are in triode region, depends on $\Delta V_{GS34}$ voltage, $I_1$ current, and $V_{DD}-V_{DDO}=V_{DS1}$. Looking into the above equations is possible to notice that $V_{DS2}$ has the $-\Delta V_{GS34}$ term when compared to $V_{DS1}$. This way $V_{DS2}$ will decrease more than $V_{DS1}$. Also considering that $V_{GS2}$ is inversely proportional to $V_{DS2}$, the net effect is that while $V_{DDO}$ approaches to $V_{DD}$ value, $V_{DS1}$ decreases, $V_{DS2}$ decreases more and $V_{GS2}$ increases making $I_{LIM}$ also increase.

$V_{GS2}$ voltage will increase until reach its limit, in this case current source I10 will have a decay from $I_1$ value when node n1 voltage is close to reference node 106 voltage (0 V) and also because of reaching the limit $V_{GS2}=V_{DD}$. After this point, as $V_{DDO}$ approaches $V_{DD}$, only $V_{DS1}$ decreases ($V_{DS1}=V_{DD}-V_{DDO}$) and therefore $I_{LIM}$ decreases. Notice that it is possible to limit $V_{GS2}$ voltage in other ways, such as, for instance, by using a zener diode or the like.

In sum, when $V_{DD}$ is greater than $V_{DDO}$ and transistor M2 is in saturation, transistors M1 and M2 act as a current mirror. When the value of $V_{DD}$ is close to $V_{DDO}$ and M2 is in triode, the value of the current limitation provided by transistor M1 rises because $(W_4/L_4)>(W_3/L_3)$. Moreover, when $V_{DD}$ has approximately the same value as $V_{DDO}$ and M2 is in linear region, M3 has less current capability than M4, and node n1 is pulled down to reference node 106, and therefore transistor M1, in this state, provides no current limitation.

Figure 3:
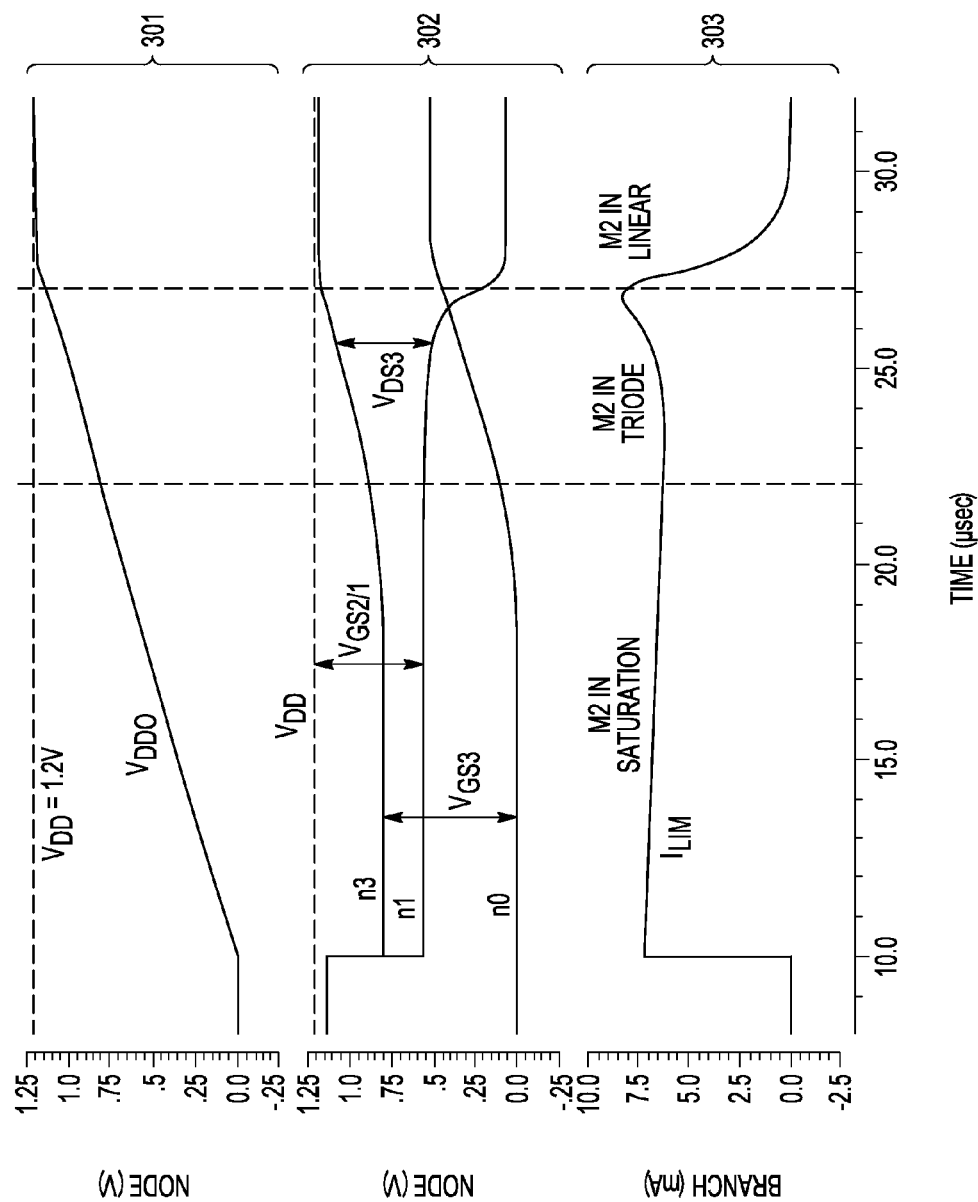
FIG. 3 shows graphs illustrating aspects of the operation of a power switch with current limitation according to some embodiments.

To illustrate the foregoing, the graphs of FIG. 3 show aspects of the operation of power switch 104A according to some embodiments. Particularly, graph 301 shows the values of $V_{DD}$ and $V_{DDO}$ change during a transition (e.g., power-up) period. In this example, it may be noted that $V_{DD}$ voltage is constant (1.2 V), whereas it takes $V_{DDO}$ approximately 20 μs to reach the same value as $V_{DD}$. In some cases, the transition period may last 30 μs or less.

Graph 302 shows the various node voltages of n0, n1, and n2 as $V_{DDO}$ changes over the course of the transition period, as well as the $V_{GS}$ voltages for transistors M3 and M2. Meanwhile, graph 303 shows the variations of current $I_{LIM}$ during the transition. It may be noted that, while transistor M2 is in saturation (between approximately 10 μs and 22 μs) and in triode (between approximately 22 μs and 29 μs) modes, the value of $I_{LIM}$ stays constant. When transistor M2 switches from triode to linear modes (at approximately 29 μs when $V_{DDO}$ voltage is very close to $V_{DD}$), the voltage at node n1 is pulled to reference node 106 and the value of $I_{LIM}$ increases before dropping to zero.

Figure 4:
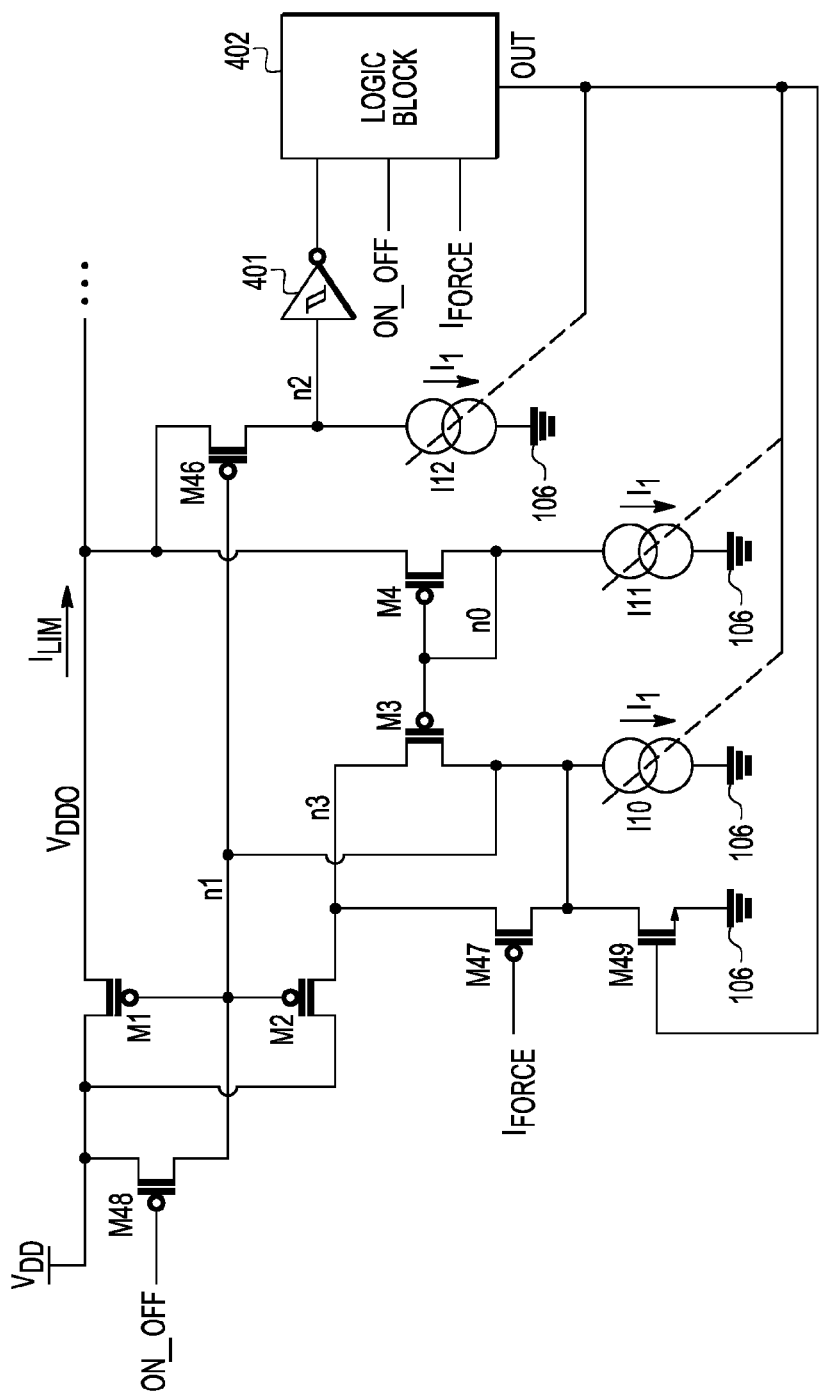
FIG. 4 is a circuit diagram of an example of a power switch with current limitation and zero Direct Current (DC) power consumption according to some embodiments.

FIG. 4 is a circuit diagram of an example of power switch 104A with current limitation and zero Direct Current (DC) consumption. In contrast with in FIG. 3, this embodiment adds PMOS transistors M46, M47, M48, and M49, as well as inverter 401 and logic block 402. Transistor M48 has its source coupled to the source of transistor M1 and its drain coupled to the gate of transistor M46. Transistor M46 has its source coupled to the drain of transistor M1 and its drain coupled to node n2 and to current source I12. Transistor M47 has its source coupled to the source of transistor M3 and its drain coupled to node n1, to drain of M3 and to source current I10.

In operation, transistor M46 is configured to operate as an end-of-transition sensor. When an "on-off" signal is applied to make transistor M48 non-conductive as the transition begins, transistor M46 detects whether the difference between $V_{DDO}$ and $V_{DD}$ is below a threshold level (this means $V_{DDO}$ is very close to $V_{DD}$), and provides a signal indicative of whether the transition period has ended to inverter 401. Inverter 401 is in turn coupled to logic circuitry 402, and is configured to receive that indication and to turn off current sources I10, I11, and I12, and make transistor M49 conductive in response to the transition period having ended. As such, upon receiving the same "on-off" signal as transistor M48, logic circuitry 403 is able to null current consumption if switch 104A is stable, whether M1 is conductive (that is, switch 104A is "on") or non-conductive (that is, switch 104A is "off").

As explained above, after the transition period is complete, transistor M1 is fully conductive and does not provide current limitation. In this case, the current limitation feature may be retriggered by making transistor M47 conductive and by turning on current sources I10, I11, and I12, while making transistor M49 non-conductive. In this configuration, transistors M1 and M2 are forced to a current mirror configuration and the current limitation feature is active.

It should also be noted that, although the foregoing circuit analysis has been done with MOS transistor equations for strong inversion, the circuits described herein perform the same operations with MOS transistors operating in moderate or weak inversion regions. In this scenario, the current limitation has the same value as in the strong inversion region, while transistors M1 and M2 are in saturation mode.

As a person of ordinary skill in the art will understand in light of this disclosure, each of the various transistors discussed above may itself represent a plurality of transistors in suitable configurations (e.g., in parallel with each other). Moreover, although the examples described above make use of PMOS transistors, similar principles may be applied to design a power switch with current limitation and zero DC consumption using NMOS technologies.

As described herein, in an illustrative, non-limiting embodiment, an electronic device may include a power supply, an integrated circuit including plurality of power domains, and a switching circuit coupled between the power supply and a given one of the plurality of power domains. The switching circuit may include a first current mirror including a first transistor and a second transistor, the first transistor including a first current terminal coupled to the voltage supply node, the first transistor including a second current terminal coupled to the given one of the plurality of power domains, the second transistor including a first current terminal coupled to the first current terminal of the first transistor, and the second transistor including a control terminal coupled to a control terminal of the first transistor. The switching circuit may also include a second current mirror including a third transistor and a fourth transistor, the third transistor including a first current terminal coupled to a second current terminal of the second transistor, the third transistor including a second control terminal coupled to a first current source and to the control terminals of the first and second transistors, the fourth transistor including a first current terminal coupled to the second current terminal of the first transistor, the fourth transistor including a second current terminal coupled to a second current source, and the fourth transistor including a control terminal coupled to a control terminal of the third transistor and to the second current terminal of the fourth transistor.

In some implementations, the first, second, third, and fourth transistors may be PMOS transistors. Also, a difference between voltages at the first and second current terminals of the first transistor may determine whether the second transistor operates in saturation, triode, or linear mode.

The switching circuit may be configured to limit an amount of current drawn by the given one of the plurality of power domains from the power supply during a transition period, and further configured to consume zero DC power outside of the transition period. For example, the switching circuit may include a fifth transistor including a first current terminal coupled to the first current terminal of the fourth transistor, a control terminal coupled to the control terminals of the first and second transistors, and a second current terminal coupled to a third current source, the second current terminal of the fifth transistor configured to provide a signal indicative of whether the transition period has ended. The switching circuit may further include a sixth transistor coupled to control terminal of the first and second transistors and to the second current terminal of the third transistor.

A logic circuit may be coupled the switching circuit, the logic circuit configured to reconfigure the switching circuit in response to a determination that a voltage drop across the switching circuit is below a threshold value. For instance, reconfiguring the switching circuit may include turning off the first, second, and third current sources, and making the sixth transistor conductive.

In some cases, the transition period may include powering up of the given one of the plurality of power domains. As such, the transition period may last 30 µs or less. Also, the limit may be proportional to an aspect ratio of the first transistor divided by an aspect ratio of the second transistor, and an aspect ratio of the fourth transistor may be greater than an aspect ratio of the third transistor.

In another illustrative, non-limiting embodiment, a method may include controlling, via a switching circuit coupled between a voltage supply and an integrated circuit, an amount of current drawn by the integrated circuit from the voltage supply during a transition period; and causing the switching circuit to consume no static power during periods of time other than the transition period. For example, the integrated circuit may be one of a plurality of different power domains within another integrated circuit. The transition period may include a powering up of the integrated circuit, and it may be 30 µs or less. In some implementations, causing the switching circuit to consume no static power may include decoupling the switching circuit from a ground node in response to a determination that the transition period has ended.

In yet another illustrative, non-limiting embodiment, an integrated circuit may include switching circuitry coupled between a voltage supply node and a given one of a plurality of power domains, the switching circuitry configured to limit an amount of current drawn by the given power domain from the voltage supply node during a transition period, the switching circuitry further configured to consume zero DC power outside of the transition period. The integrated circuit may further include a logic circuit coupled the switching circuitry, the logic circuit configured to reconfigure the switching circuitry in response to a determination that a voltage drop across the switching circuitry is below a threshold value. Also, the transition period may include powering up of the given one of the plurality of power domains.

In many implementations, the systems and methods disclosed herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 5:
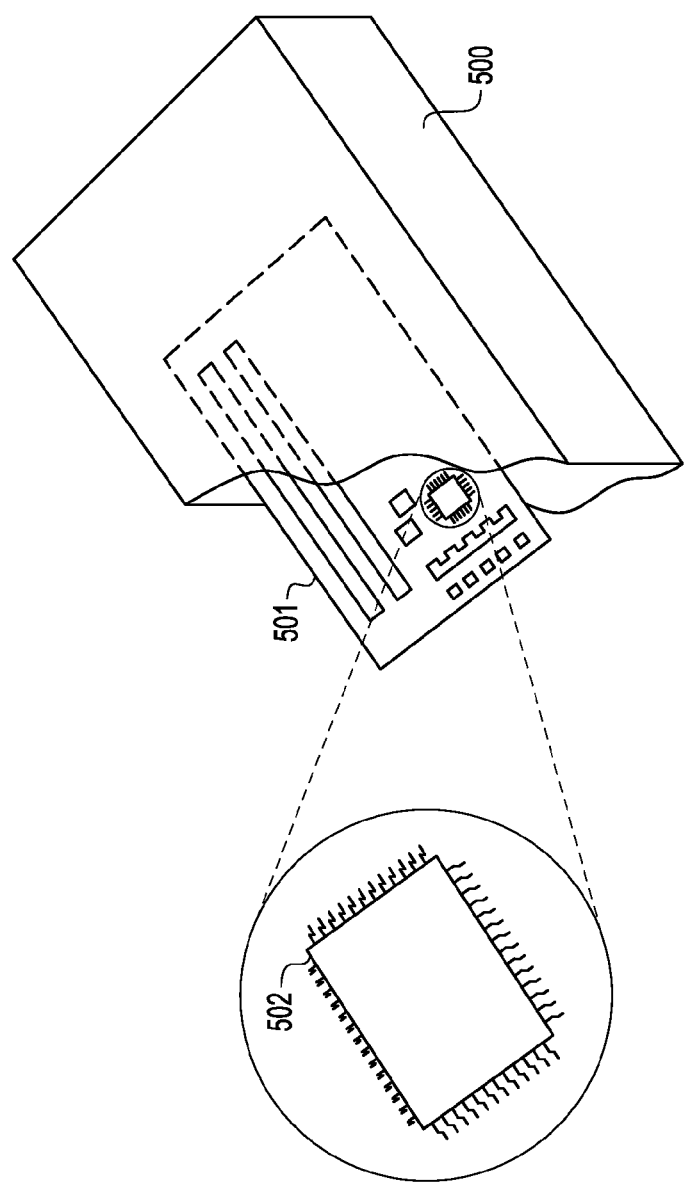
FIG. 5 is a diagram of an example of an electronic device having one or more electronic microelectronic device packages, according to some embodiments.

Turning to FIG. 5, a block diagram of electronic device 500 is depicted. In some embodiments, electronic device 500 may be any of the aforementioned electronic devices, or any other electronic device. As illustrated, electronic device 500 includes one or more Printed Circuit Boards (PCBs) 501, and at least one of PCBs 501 includes one or more microelectronic device packages(s) 502. In some implementations, device package(s) 502 may include one or more power switches with current limitation and zero DC consumption, such as, for example, switch 104A discussed above.

Examples of device package(s) 502 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), a Graphics Processing Unit (GPU), or the like. Additionally or alternatively, device package(s) 502 may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, device package(s) 502 may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, device package(s) 502 may include one or more Micro-ElectroMechanical Systems (MEMS), Nano-ElectroMechanical Systems (NEMS), or the like.

Generally speaking, device package(s) 502 may be configured to be mounted onto PCB 501 using any suitable packaging technology such as, for example, Ball Grid Array (BGA) packaging or the like. In some Applications, PCB 501 may be mechanically mounted within or fastened onto electronic device 500. It should be noted that, in certain implementations, PCB 501 may take a variety of forms and/or may include a plurality of other elements or components in addition to device package(s) 502. It should also be noted that, in some embodiments, PCB 501 may not be used and/or device package(s) 502 may assume any other suitable form(s).

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An electronic device, comprising:
 a power supply;
 an integrated circuit including a plurality of power domains; and
 a switching circuit coupled between the power supply and a given one of the plurality of power domains, the switching circuit including:
  a first current mirror including a first transistor and a second transistor, the first transistor including a first current terminal coupled to the voltage supply node, the first transistor including a second current terminal coupled to the given one of the plurality of power domains, the second transistor including a first current terminal coupled to the first current terminal of the first transistor, and the second transistor including a control terminal coupled to a control terminal of the first transistor; and
  a second current mirror including a third transistor and a fourth transistor, the third transistor including a first current terminal coupled to a second current terminal of the second transistor, the third transistor including a second control terminal coupled to a first current source and to the control terminals of the first and second transistors, the fourth transistor including a first current terminal coupled to the second current terminal of the first transistor, the fourth transistor including a second current terminal coupled to a second current source, and the fourth transistor including a control terminal coupled to a control terminal of the third transistor and to the second current terminal of the fourth transistor;
 wherein the switching circuit is configured to limit an amount of current drawn by the given one of the plurality of power domains from the power supply during a transition period, the switching circuit further configured to consume zero Direct Current (DC) power outside of the transition period, and wherein the switching circuit further comprises a fifth transistor including a first current terminal coupled to the first current terminal of the fourth transistor, a control terminal coupled to the control terminals of the first and second transistors, and a second current terminal coupled to a third current source, the second current terminal of the fifth transistor configured to provide a signal indicative of whether the transition period has ended.

2. The electronic device of claim 1, wherein the first, second, third, and fourth transistors are P-type Metal-Oxide-Semiconductor (PMOS) transistors.

3. The electronic device of claim 1, wherein a difference between voltages at the first and second current terminals of the first transistor determines whether the second transistor operates in saturation, triode, or linear mode.

4. The electronic device of claim 1, the switching circuit further comprising a sixth transistor coupled to the control terminal of the first and second transistors and to the second current terminal of the third transistor.

5. The electronic device of claim 4, further comprising a logic circuit coupled the switching circuit, the logic circuit configured to reconfigure the switching circuit in response to a determination that a voltage drop across the switching circuit is below a threshold value.

6. The electronic device of claim 5, wherein reconfiguring the switching circuit includes turning off the first, second, and third current sources, and making the sixth transistor conductive.

7. The electronic device of claim 1, wherein the transition period includes powering up of the given one of the plurality of power domains.

8. The electronic device of claim 1, wherein the transition period lasts 30 µs or less.

9. The electronic device of claim 1, wherein the limit is proportional to an aspect ratio of the first transistor divided by an aspect ratio of the second transistor.

10. The electronic device of claim 1, wherein an aspect ratio of the fourth transistor is greater than an aspect ratio of the third transistor.

11. A method, comprising:
 controlling, via a switching circuit coupled between a voltage supply and an integrated circuit including a plurality of power domains, an amount of current drawn by the integrated circuit from the voltage supply during a transition period, the switching circuit further comprising:
  a first current mirror including a first transistor and a second transistor, the first transistor including a first current terminal coupled to the voltage supply, the first transistor including a second current terminal coupled to a given one of the plurality of power domains, the second transistor including a first current terminal coupled to the first current terminal of the first transistor, and the second transistor including a control terminal coupled to a control terminal of the first transistor; and
  a second current mirror including a third transistor and a fourth transistor, the third transistor including a first current terminal coupled to a second current terminal of the second transistor, the third transistor including a second control terminal coupled to a first current source and to the control terminals of the first and second transistors, the fourth transistor including a first current terminal coupled to the second current terminal of the first transistor, the fourth transistor including a second current terminal coupled to a second current source, and the fourth transistor including a control terminal coupled to a control terminal of the third transistor and to the second current terminal of the fourth transistor; wherein the switching circuit is configured to limit an amount of current drawn by the given one of the plurality of power domains from the power supply during a transition period, the switching circuit further configured to consume zero Direct Current (DC) power outside of the transition period, and wherein the switching circuit further comprises a fifth transistor including a first current terminal coupled to the first current terminal of the fourth transistor, a control terminal coupled to the control terminals of the first and second transistors, and a second current terminal coupled to a third current source, the second current terminal of the fifth transistor configured to provide a signal indicative of whether the transition period has ended; and causing the switching circuit to consume no static power during periods of time other than the transition period.

12. The method of claim 11, wherein the integrated circuit is one of a plurality of different power domains within another integrated circuit.

13. The method of claim 11, wherein the transition period includes a powering up of the integrated circuit.

14. The method of claim 13, wherein the transition period is 30 μs or less.

15. The method of claim 11, wherein causing the switching circuit to consume no static power includes decoupling the switching circuit from a ground node in response to a determination that the transition period has ended.

16. An integrated circuit, comprising:
   switching circuitry coupled between a voltage supply node and a given one of a plurality of power domains, the switching circuitry configured to limit an amount of current drawn by the given power domain from the voltage supply node during a transition period, the switching circuitry further configured to consume zero Direct Current (DC) power outside of the transition period, the switching circuit further comprising:
      a first current mirror including a first transistor and a second transistor, the first transistor including a first current terminal coupled to the voltage supply node, the first transistor including a second current terminal coupled to the given one of the plurality of power domains, the second transistor including a first current terminal coupled to the first current terminal of the first transistor, and the second transistor including a control terminal coupled to a control terminal of the first transistor; and
      a second current mirror including a third transistor and a fourth transistor, the third transistor including a first current terminal coupled to a second current terminal of the second transistor, the third transistor including a second control terminal coupled to a first current source and to the control terminals of the first and second transistors, the fourth transistor including a first current terminal coupled to the second current terminal of the first transistor, the fourth transistor including a second current terminal coupled to a second current source, and the fourth transistor including a control terminal coupled to a control terminal of the third transistor and to the second current terminal of the fourth transistor; wherein the switching circuit is configured to limit an amount of current drawn by the given one of the plurality of power domains from the power supply during a transition period, the switching circuit further configured to consume zero Direct Current (DC) power outside of the transition period, and wherein the switching circuit further comprises a fifth transistor including a first current terminal coupled to the first current terminal of the fourth transistor, a control terminal coupled to the control terminals of the first and second transistors, and a second current terminal coupled to a third current source, the second current terminal of the fifth transistor configured to provide a signal indicative of whether the transition period has ended.

17. The integrated circuit of claim 16, further comprising a logic circuit coupled the switching circuitry, the logic circuit configured to reconfigure the switching circuitry in response to a determination that a voltage drop across the switching circuitry is below a threshold value.

18. The integrated circuit of claim 16, wherein the transition period includes powering up of the given one of the plurality of power domains.

* * * * *